(12) United States Patent
Liu et al.

(10) Patent No.: US 11,043,950 B2
(45) Date of Patent: Jun. 22, 2021

(54) METHOD AND SYSTEM FOR PROVIDING A CONFIGURABLE LOGIC DEVICE HAVING A PROGRAMMABLE DSP BLOCK

(71) Applicants: Jianhua Liu, San Jose, CA (US); Chienkuang Chen, Santa Clara, CA (US)

(72) Inventors: Jianhua Liu, San Jose, CA (US); Chienkuang Chen, Santa Clara, CA (US)

(73) Assignee: GOWIN Semiconductor Corporation, GuangZhou (CN)

( * ) Notice: Subject to any disclaimer, the term of this patent is extended or adjusted under 35 U.S.C. 154(b) by 0 days.

(21) Appl. No.: 16/586,891

(22) Filed: Sep. 27, 2019

(65) Prior Publication Data

US 2021/0099175 A1 Apr. 1, 2021

(51) Int. Cl.
*H03K 19/17728* (2020.01)
*H03K 19/17704* (2020.01)
*H03K 19/17736* (2020.01)

(52) U.S. Cl.
CPC . *H03K 19/17728* (2013.01); *H03K 19/17712* (2013.01); *H03K 19/17744* (2013.01)

(58) Field of Classification Search
CPC ....... H03K 19/17728; H03K 19/17712; H03K 19/17744
See application file for complete search history.

(56) References Cited

U.S. PATENT DOCUMENTS

| | | | | |
|---|---|---|---|---|
| 7,287,051 | B1* | 10/2007 | Langhammer | G06F 7/5324 708/490 |
| 8,463,832 | B1* | 6/2013 | Hazanchuk | H03K 19/1737 708/230 |
| 8,977,885 | B1* | 3/2015 | Hazanchuk | G06F 5/06 713/600 |
| 2012/0233230 | A1* | 9/2012 | Langhammer | G06F 7/5324 708/230 |

* cited by examiner

*Primary Examiner* — Daniel D Chang
(74) *Attorney, Agent, or Firm* — James M. Wu; JW Law Group

(57) ABSTRACT

A programmable logic device ("PLD") contains programmable digital signal processing ("DSP") blocks operable to be selectively programmed to perform one or more logic functions. The PLD, in one embodiment, includes configurable logic blocks ("LBs"), an input and output ("I/O") block, and programmable DSP blocks. The configurable LBs are able to be selectively programmed to perform one or more logic functions. The I/O block includes I/O ports for facilitating data transfer. The programmable DSP blocks are configured to perform various predefined logic functions. Each of the programmable DSP blocks, in one aspect, includes at least one configurable DSP which, in one embodiment, includes a 27×18 multiplier and a 12×12 multiplier.

21 Claims, 9 Drawing Sheets

METHOD AND SYSTEM FOR PROVIDING A CONFIGURABLE LOGIC DEVICE HAVING A PROGRAMMABLE DSP BLOCK

FIELD

The exemplary embodiment(s) of the present invention relates to the field of programmable semiconductor chips for computer hardware and software. More specifically, the exemplary embodiment(s) of the present invention relates to processing components such as digital signal processing ("DSP") components in a field-programmable gate array ("FPGA") or programmable logic device ("PLD").

BACKGROUND

With increasing popularity of digital communication, artificial intelligence (AI), IoT (Internet of Things), and/or robotic controls, the demand for faster and efficient hardware and semiconductors with processing capabilities is constantly in demand. To meet such demand, high-speed and flexible semiconductor chips are generally more desirable. A conventional approach is to use dedicated custom integrated circuits and/or application-specific integrated circuits ("ASICs") to implement desirable functions. A shortcoming with ASIC approach is that this approach is generally expensive and limited flexibility.

A typical alternative approach, which enjoys the growing popularity, is utilizing programmable semiconductor devices ("PSDs") such as programmable logic devices ("PLDs") or field programmable gate arrays ("FPGAs"). A feature of PSD is that it allows an end user to program one or more desirable functions to suit his/her applications. A conventional PSD such as a typical PLD or FPGA is a semiconductor chip that includes an array of programmable logic array blocks ("LABs") or logic blocks ("LBs"), routing resources, and input/output ("I/O") pins. Each LAB may further include multiple programmable logic elements ("LEs"). For example, each LAB can include from 16 LEs to 128 LEs, wherein each LE can be specifically programmed to perform a function or a set of functions.

However, a drawback associated with a typical FPGA or PLD having built-in components such as DSPs is that such built-in functions or components lack flexibility(s).

SUMMARY

A programmable semiconductor device ("PSD") such as an FPGA or PLD contains a programmable digital signal processing ("DSP") block operable to be selectively programmed to perform one or more logic functions. The PSD, in one embodiment, includes configurable logic blocks ("LBs"), an input and output ("I/O") block, and a programmable DSP block(s). The configurable LBs are able to be selectively programmed to perform one or more logic functions. The I/O block includes I/O ports for facilitating data transfer. The programmable DSP block, in one aspect, includes a plurality of configurable DSPs ("CDSPs") for performing various digital processing computations. Each of the CDSPs, in one embodiment, includes a hybrid multiplier block ("HMB"). For example, an HMB includes a 27×18 multiplier and a 12×12 multiplier.

Additional features and benefits of the exemplary embodiment(s) of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
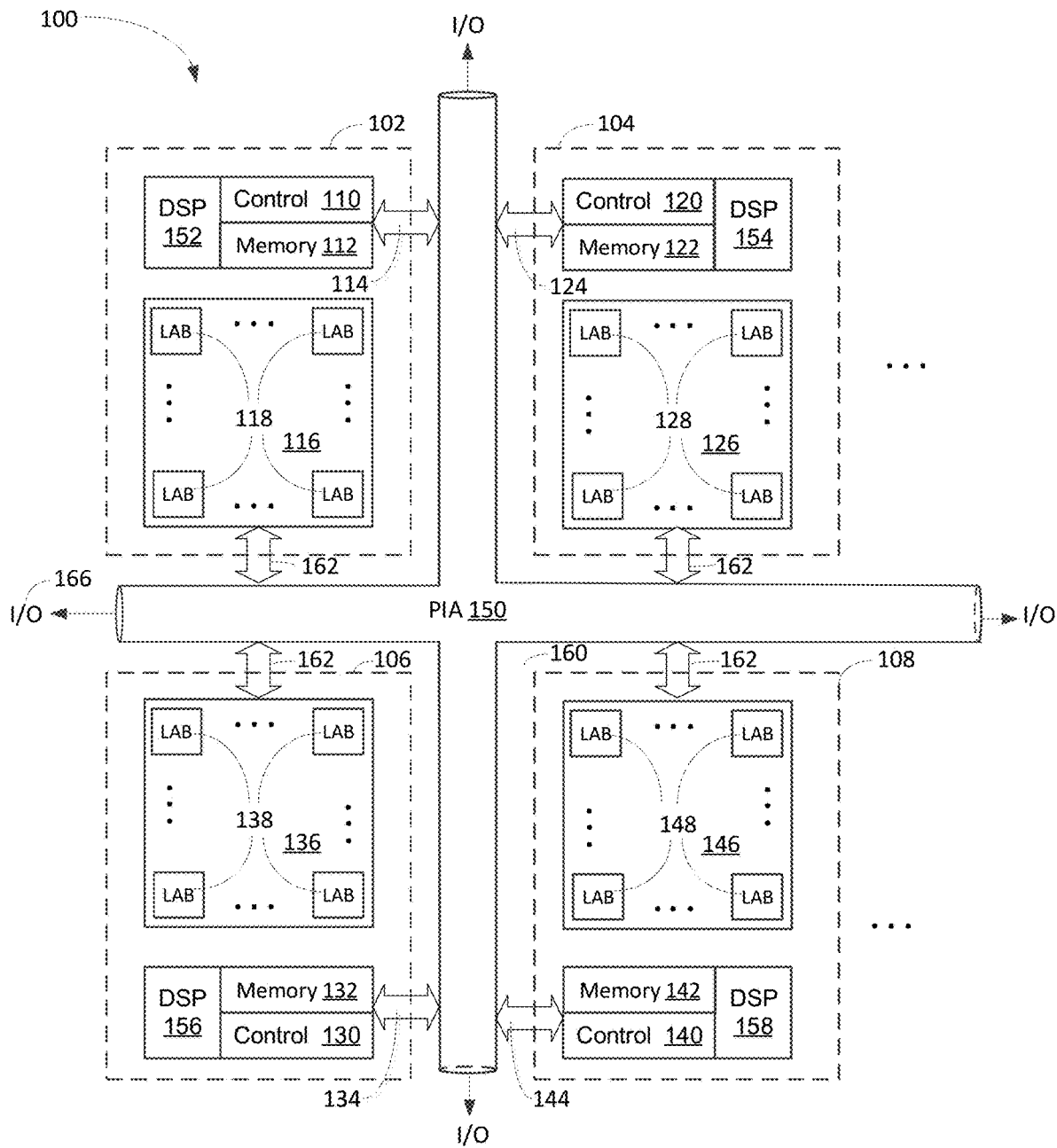
FIG. 1 is a block diagram illustrating a PSD capable of providing digital processing capabilities using one or more DSP components in accordance with one embodiment of the present invention.

Embodiments of the present invention disclose a method (s) and/or apparatus for providing a mechanism of providing a flexible or configurable DSP implementation in a programmable semiconductor device ("PSD").

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be understood that such a development effort might be complex and time-consuming but would nevertheless be a routine undertaking of engineering for those of ordinary skills in the art having the benefit of embodiment(s) of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

In accordance with the embodiment(s) of present invention, the components, process steps, and/or data structures described herein may be implemented using various types of operating systems, computing platforms, computer programs, and/or general-purpose machines. In addition, those of ordinary skills in the art will recognize that devices of a less general-purpose nature, such as hardware devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory.

The term "system" or "device" is used generically herein to describe any number of components, elements, subsystems, devices, packet switch elements, packet switches, access switches, routers, networks, computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

The PSD, in one embodiment, includes configurable LBs, I/O block(s), and/or programmable DSP block(s) for providing one or more user selected logic functions. The configurable LBs or LABs are able to be selectively programmed to perform one or more logic functions. The I/O block includes I/O ports for facilitating data transfer. The programmable DSP block, in one aspect, includes a set of configurable DSPs ("CDSPs") for performing various digital processing computations. Each of the CDSPs, in one embodiment, includes a hybrid multiplier block ("HMB"). In one aspect, an HMB includes a set of multipliers with different size of operands such as 27×18 multiplier and/or 12×12 multiplier.

FIG. 1 is a block diagram 100 illustrating a PSD capable of providing digital processing capabilities using one or more DSP components in accordance with one embodiment of the present invention. Diagram 100 includes multiple programmable partitioned regions ("PPR") 102-108, a programmable interconnection array ("PIA") 150, internal power distribution fabric, and regional input/output ("I/O") ports 166. PPRs 102-108 further includes control units 110, 120, 130, 140, memories 112, 122, 132, 142, configurable DSPs 152-158, and logic blocks ("LBs") 116, 126, 136, 146. Note that control units 110, 120, 130, 140 can be configured into one single control unit, and similarly, memory 112, 122, 132, 143 can also be configured into one single memory device for storing configurations. Also, configurable DSPs 152-158 can also be to combined into one single programmable DSP block in the PSD. It should be noted that the underlying concept of the exemplary embodiment(s) of the present invention would not change if one or more blocks (circuit or elements) were added to or removed from diagram 100.

LBs 116, 126, 136, 146, include multiple LABs 118, 128, 138, 148, wherein each LAB is further organized to contain, among other circuits, a set of programmable logical elements ("LEs") or macrocells, not shown in FIG. 1. For example, each LAB can include anywhere from 32 to 512 programmable LEs. I/O pins (not shown in FIG. 1), LABs, and LEs are linked by PIA 150 and/or other buses, such as buses 162, 114, 124, 134, 144, for facilitating communication between PIA 150 and PPRs 102-108. Each LE includes programmable circuits such as the product-term matrix, and registers. For example, every LE can be independently configured to perform sequential and/or combinatorial logic operation(s). It should be noted that the underlying concept of PSD would not change if one or more blocks and/or circuits were added or removed from PSD.

Control units 110, 120, 130, 140, also known as configuration logics, can be a single control unit. Control unit 110, for instance, manages and/or configures individual LE in LAB 118 based on the configuration stored in memory 112. It should be noted that some I/O ports or I/O pins can also be programmed as input pins as well as output pins. Some I/O pins can be further programmed as bi-directional I/O pins that are capable of receiving and sending signals at the same time. The control units such as unit 110 can also be used to handle and/or provide system clock signals for the PSD.

LBs 116, 126, 136, 146 are programmable by the end users. Depending on applications, LBs can be configured to perform user specific functions based on predefined functional library managed by programming software. Based on configurations, a portion of PSD such as PPRs 106-108 can be dynamically powered up or powered down for power conservation. PSD, in some applications, also includes a set fixed circuits for performing specific functions. For example, PSD can include a portion of semiconductor area for a fixed non-programmable processor for enhance computation power.

PIA 150 is coupled to LBs 116, 126, 136, 146 via various internal buses such as buses 114, 124, 134, 144, 162. In some embodiments, buses 114, 124, 134, 144, 162 and PDF 160 are part of PIA 150. Each bus includes channels or wires for transmitting signals. It should be noted that the terms channel, routing channel, wire, bus, connection, and interconnection are referred to similar connections and will be used interchangeably herein. PIA 150, not shown in FIG. 1, can also be used to receives and/or transmits data directly or indirectly from/to other devices via I/O pins and LABs.

A function of DSP such as DSP 152 is a special purpose processing unit capable of executing a specific set of digital processing operations with relatively high efficiency. A configurable DSP ("CDSP"), in one aspect, is a DSP that allows an end user to select the size of operands. For example, the end user can select an operation of multiplying a first operand represented in 27 bits with a second operand represented in 18 bits. Alternatively, an end user can select a multiplication operation with 27×36 using two CDSPs.

An advantage of employing a programmable DSP block is to provide additional flexibility of a built-in PSD component.

Figure 2:
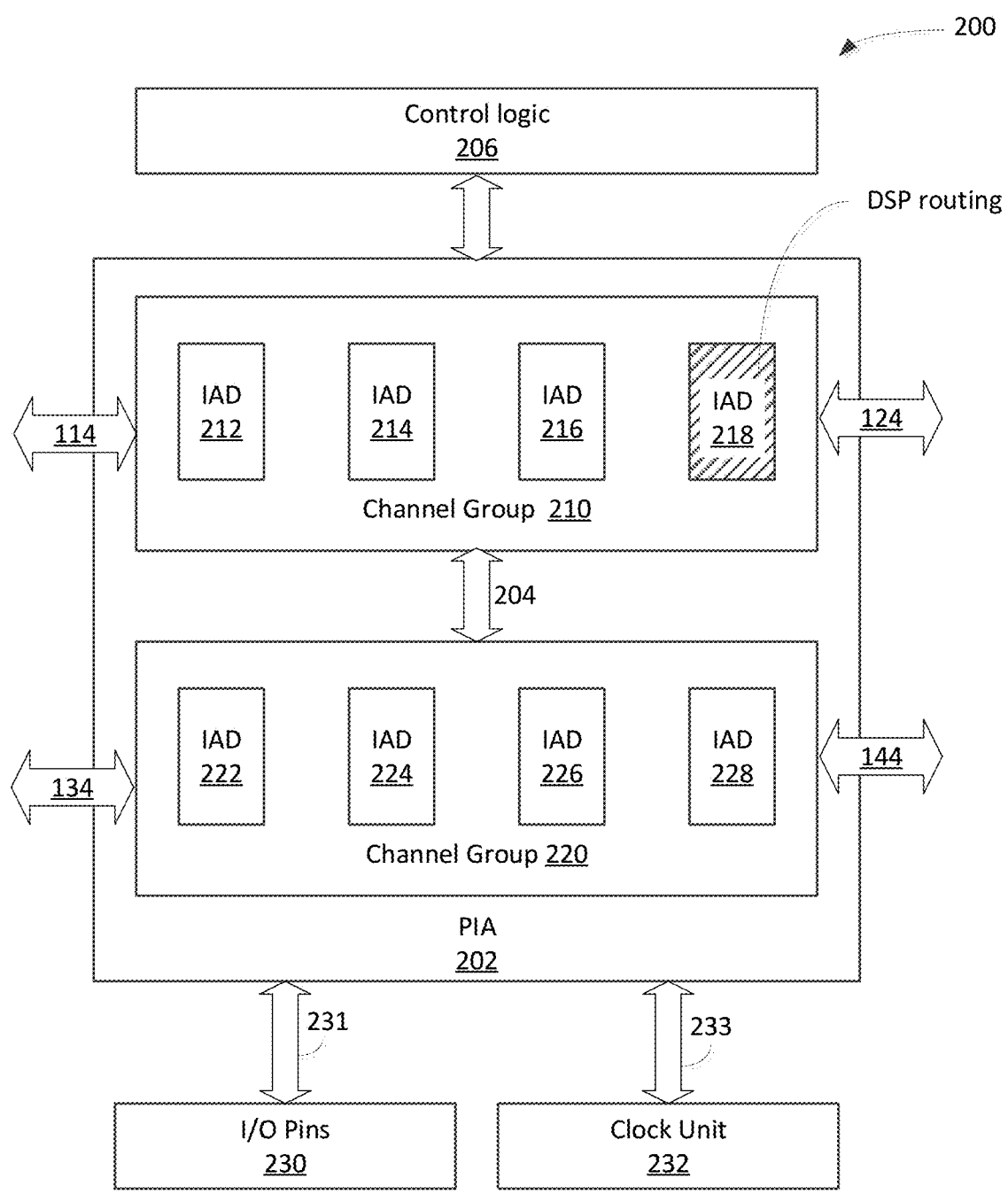
FIG. 2 is a block diagram illustrating a routing logic or routing fabric containing programmable interconnection arrays including DSP routing in accordance with one embodiment of the present invention.

FIG. 2 is a block diagram 200 illustrating a routing logic or routing fabric containing programmable interconnection arrays including DSP routing in accordance with one embodiment of the present invention. Diagram 200 includes control logic 206, PIA 202, I/O pins 230, and clock unit 232.

Control logic 206, which may be similar to control units shown in FIG. 1, provides various control functions including channel assignment, differential I/O standards, and clock management. Control logic 206 can includes volatile memory, non-volatile memory, and/or a combination of volatile and nonvolatile memory device. In one embodiment, control logic 206 is incorporated into PIA 202. It should be noted that the underlying concept of the exemplary embodiment(s) of the present invention would not change if one or more blocks (circuit or elements) were added to or removed from diagram 200.

I/O pins 230, in one example, connected to PIA 202 via a bus 231, includes multiple programmable I/O pins that can receive and transmit signals to outside of PSD. Each programmable I/O pin, for instance, can be configured as to whether it is an input, output, and/or bi-directional pin. I/O pins 230 may be incorporated into control logic 206 depending on applications.

Clock unit 232, in one example, connected to PIA 202 via a bus 233, receives various clock signals from other components, such as a clock tree circuit or a global clock oscillator. Clock unit 232, in one instance, generates clock signals in response to system clocks as well as reference clocks for implementing I/O communications. Depending on the applications, clock unit 232 provides clock signals to PIA 202 including reference clock(s).

PIA 202, in one aspect, is organized in an array scheme having multiple channel groups 210 and 220, bus 204, and I/O buses 114, 124, 134, 144. Channel groups 210, 220 are used to facilitate routing information between LBs based on PIA configurations. Channel groups can also communicate with each other via internal buses or connections such as bus 204. Channel group 210 further includes interconnect array decoders ("IADs") 212-218 and channel group 220 includes four IADs 222-228. A function of IAD is to provide a configurable routing resources for data transmission.

For example, an IAD such as IAD 212 includes routing circuits, such as routing multiplexers or selectors, hereinafter called multiplexers, for routing various signals between I/O pins, feedback outputs, and LAB inputs. Each IAD is organized in a number of multiplexers for routing various signals received by IAD. For example, an IAD can include 36 multiplexers which can be laid out in four banks that each bank contains nine rows of multiplexers. Thus, each bank of IAD, for instance, can choose any one or all of the nine multiplexers to route one or nine signals that IAD receives. It should be noted that the number of IADs within each channel group is a function of the number of LEs within the LAB. In one embodiment, IAD is programmable and it can be configured to route the signals in a most efficient way. To enhance routability, IAD employs configurable multiplexing structures so that a configurable mux allows a portion of its mux to be used by another mux in an adjacent IAD.

In one embodiment, PIA 202 is configured to designate a special IAD such as IAD 218 to provide routing for DSP related functions. For example, IAD 218 is configured to facilitate operand's channel width for signal processing. It should be noted that additional IADs may be allocated for DSP operation based on the applications.

An advantage of using IAD 218 within PIA as a designated DSP routing is to facilitate efficient DSP throughput for real-time operations.

Figure 3A:
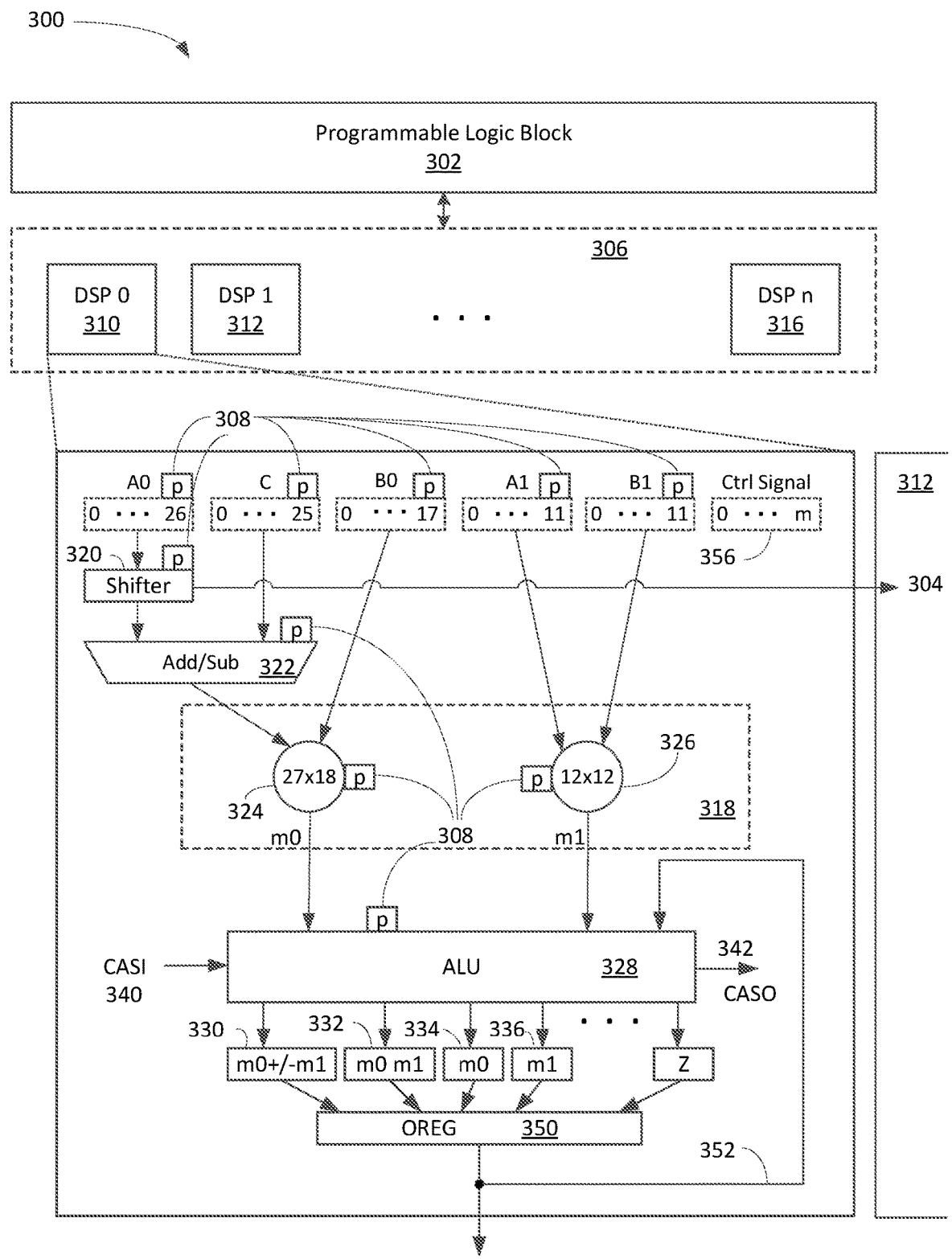
FIGS. 3A-3B are block diagrams illustrating a PSD containing various LBs and a programmable DSP block containing one or more HMBs in accordance with one embodiment of the present invention.

FIG. 3A is a block diagram 300 illustrating a PSD containing various LBs and a programmable DSP block containing one or more HMBs in accordance with one embodiment of the present invention. The PSD includes a programmable LB 302, a programmable DSP block 306 wherein programmable LB 302 can includes various LABs and/or LEs. It should be noted that PSD can include more than one programmable LB 302 and/or programmable DSP block 306. It should be noted that the underlying concept of the exemplary embodiment(s) of the present invention would not change if one or more blocks (circuit or elements) were added to or removed from diagram 300.

LB 302, which is similar to LB 116, is programmable by the end users to perform user specific functions based on predefined functional library managed by the software. Based on the configurations, LB 302 can include multiple subsections across the semiconductor chip. LB 302, in one example, is further organized in LABs wherein each LAB is further divided into programmable LEs or macrocells, not shown in FIG. 3A. In one example, the PSD includes a group of configurable LBs and at least one programmable DSP block wherein the configurable LBs can be selectively programmed to perform one or more logic functions.

Programmable DSP block 306 includes at least one CDSP such as DSP0 310. Alternatively, programmable DSP block 306 includes multiple DSPs from DSP0 310 to DSPn 316. Each CDSP such as DSP0 310 includes registers for inputs, shifter 320, pre-adder ("Padd") 322, HMB 318, arithmetic logic unit ("ALU") 328, and an output register ("Oreg") 350. Inputs or input data includes operand A0, A1, B0, B1, C, and control signals 356. In one aspect, operand A0 is an input represented by 27 bits and operand A1 is an input represented by 12 bits. While operand B0 is an 18-bit operand and B1 is a 12-bit operand, operand C is a 26-bit input. Control signal 356, in one aspect, provides controlling and/or programming signals to program various programmable cells ("p") 308.

CDSP 310, in one aspect, includes one or more HMBs 318. Each HMB such as HMB 318 includes multiple multipliers. For example, HMB 318 includes a first multiplier 324 and a second multiplier 326 wherein first multiplier 324 is operable to multiply a first set of operands having a first set of bit numbers such as 27×18. Second multiplier 326 is operable to multiply a second set of operands with a set of the second bit numbers such as 12×12. The first set of bit numbers are different from the second set of bit numbers. For example, the first set of bit number can be 27×18 (27 bits by 18 bits) while the second set of bit numbers can be 12×12. For example, multiplier 324 having its operands represented in 27×18 bits can be referred to as 27×18 multiplier. Similarly, 12×12 multiplier such as multiplier 326 is a multiplier able to multiply two 12-bit operands. Referring back to FIG. 3A, HMB 318, in one embodiment, includes a 27×18 multiplier 324 and a 12×12 multiplier 326. It should be noted that HMB 318 can include additional multipliers with different size of operands.

Padd 322, in one example, is able to perform an operation of adding before multiplication. For example, if Padd 322 configured to group with multiplier 324, the combination of Padd 322 and multiplier 324 can achieve a mathematic operation of (A+/−C)×B where A, B, and C are operands. Shifter 320 is able to shift at least a portion of data from CDSP 310 to a neighboring CDSP such as CSDP 312 as indicated by number 304.

ALU 328 is a data output component ("DOUT") capable of receiving product results from multipliers 324-326, cascade input ("CASI") 340 from a neighboring CDSP, and a previous feedback of ALU 328 as indicated by number 352. ALU 328, in one embodiment, can be configured to perform an arithmetic function or functions, such as, but not limited to, an addition, subtraction, appending, accumulator, filtering, and the like. For example, ALU 328 is able to add or subtract product results m0, m1 from multipliers 324-326 to generate a result as indicated by numeral 330. Also, ALU 328 is able to append or concatenate product results m0, m1 from multipliers 324-326 to generate a result as indicated by numeral 332. ALU 328 can also be programmed to filter out product result m1 from multiplier 326 to generate a result as indicated by numeral 334. Moreover, ALU 328 can be programmed to filter out product result m0 from multiplier 324 to generate a result as indicated by numeral 336. Depending on the applications, ALU 328 can also be programmed to perform other functions such as generating a cascade output ("CASO") 342. CASO 342 is a generated result that is passed directly to a neighboring CDSP such as CDSP 312.

Oreg 350 is an output register capable of latching the result(s) from ALU 328 in accordance with the clock cycles. It should be noted that PSD 300 may also include an I/O block, not shown in FIG. 3A, containing multiple I/O ports for facilitating data transfer between the PSD and the host system.

An advantage of using an HMB in DSP is that it provides flexibility for multiplications with different size of operands. For example, an HMB containing a 27×18 multiplier and a 12×12 multiplier can be programmed to operate as two 12×12 multipliers.

Figure 3B:
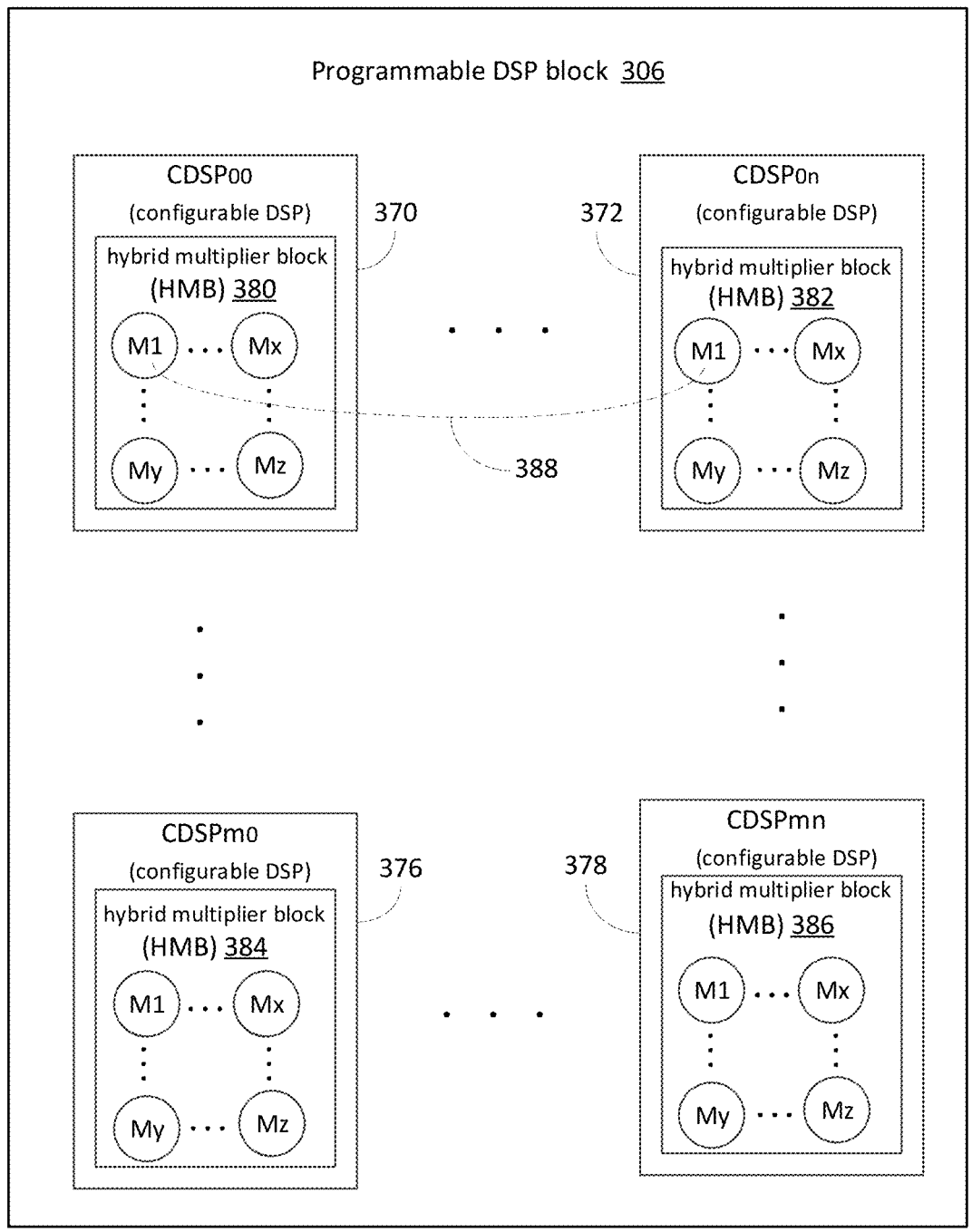

FIG. 3B is a block diagram illustrating a programmable DSP block 306 containing various CDSPs in accordance with one embodiment of the present invention. Programmable DSP block 306, in one aspect, includes multiple $CDSP_{00}$-$CDSP_{mn}$ 370-378. In one aspect, $CDSP_{00}$-$CDSP_{mn}$ 370-378 can be split into multiple subsections situated at different portion of the chip. It should be noted that the PSD can contain one or more programmable DSP blocks. It should be noted that the underlying concept of the exemplary embodiment(s) of the present invention would not change if one or more blocks (circuit or elements) were added to or removed from FIG. 3B.

Each CDSP such as $CDSP_{00}$ further includes one or more HMB 380 wherein each HMB 380 includes a set of multipliers. The set of multipliers, in one embodiment, can have different size of multipliers. For example, multiplier M1 can be a 12×12 multiplier while multiplier Mx may be a 27×18 multiplier. In one embodiment, HMBs 380-386 are the same or substantially the same HMBs. Alternatively, HMBs 380-386 can be different HMBs depending on the application. In one aspect, multipliers in different HMBs can be linked to perform a particular function as indicated by numeral 388.

An advantage of using an HMB is to provide additional flexibility to use multiple multipliers in different HMBs to perform one function.

Figure 4:
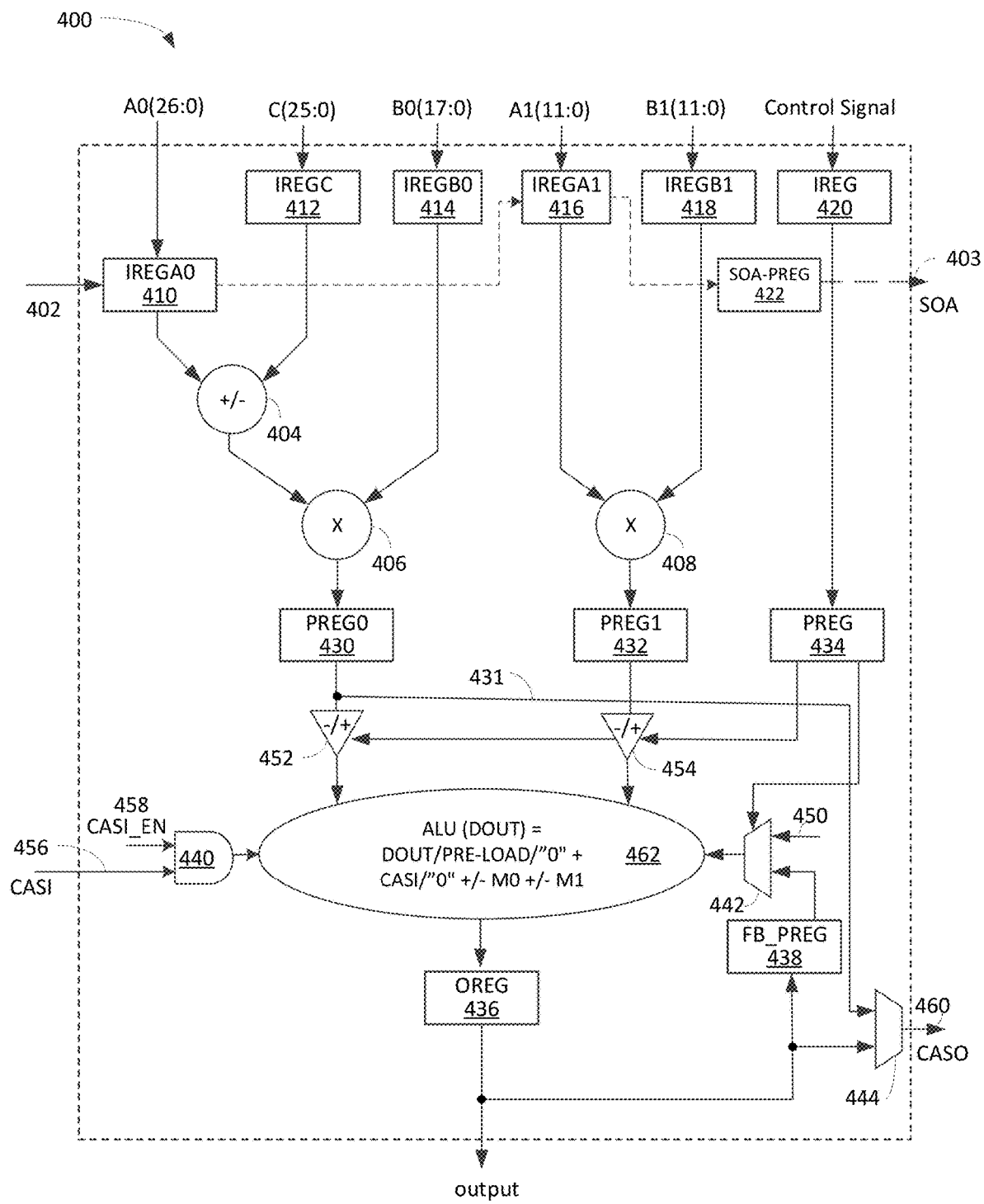
FIG. 4 is a block diagram illustrating a more detailed configurable DSP containing an HMB for providing signal processing in accordance with one embodiment of the present invention.

FIG. 4 is a block diagram 400 illustrating a more detailed CDSP containing an HMB for providing signal processing in accordance with one embodiment of the present invention. Diagram 400 includes input operands A0, A1, B0, B1, C, control signals, Padd 404, multipliers 406-408, ALU 462, and various registers. ALU 462 which is the same or similar to ALU or DOUT 328 shown in FIG. 3A is used to facilitate providing data output for CDSP. It should be noted that the underlying concept of the exemplary embodiment(s) of the present invention would not change if one or more blocks (circuit or elements) were added to or removed from diagram 400.

The various registers include input register A0 ("IregA0") 410, input register C ("IregC") 412, input register B0 ("IregB0") 414, input register A1 ("IregA1") 416, input register B1 ("IregB1") 418, and input register ("Ireg") 420 for control signals. In one embodiment, IregA0 410 is 27 bits wide capable of receiving and storing operand A0. IregA0 410 can also be used as a shifter or shifter register capable of shifting at least a portion of content in IregA0 410 to a nearby neighboring CDSP as indicated by numeral 403 via one or more registers depending on the applications. For example, the shifting content in IregA0 is first shifted to IregA1 in response to the clock cycles before shifting to a nearby CDSP. Alternatively, SOA-Preg (shift-out A pre-register) 422 can be used to facilitate data shift-out A ("SOA") to a neighboring CDSP in accordance with various system clock cycles.

IregC 412, in one embodiment, is a 26-bit wide and is configured to receive a C operand containing up to 26 bits. After content of A0 at IregA0 410 being added to or subtracted from the content of C operand at IregC 412 using Padd 404, the summation or result from Padd 404 is forwarded to multiplier 406 which could be a 27×18 multiplier. Upon receipt of B0 at IregB0 414, B0 having up to 17 bits value or data is multiplied with the result of A0+/−C from Padd 404. The product result of multiplier 406 is subsequently stored at a register ("Preg0") 430. In one aspect, the content of Preg0 430 can be forwarded as CASO via connection 431 to a nearby neighboring CDSP as indicated by numeral 460.

IregA1 416, in one embodiment, is a 12-bit register able to receive A1 operand with 12-bit data. IregB1 418 is also a 12-bit register able to receive B1 operand having a 12-bit value. After multiplication between the content of IregA1 416 and content of IregB1 418 by multiplier 408, the second product result from multiplier 408 is latched at a register ("Preg1") 432. The control signals at Ireg 420, in one example, are distributed across the DSP for programming and/or controlling purposes. For example, the control signals are configured to control switches 452-454 to determine whether an add, subtract, and/or filter should be performed.

ALU 462 is able to receive data from the product results from Preg0-Preg1 430-432, CASI 456, and/or previous feedback via mux 442. In one embodiment, mux 442 which is control by a control signal is able to receive a predefined number or a pre-load number 450. The previous feedback, in one example, is stored or latched by a register ("FB_Preg") 438 in accordance with clock cycles. While the content of output register ("Oreg") 436 is an output of CDSP, the content of Oreg 436 can also be cascaded or passed directly to a neighboring CDSP as indicated by CASO 460. In one aspect, CASI 456 is gated by an AND gate 440 controlled by CASI-en (enabling signal) 458.

In one embodiment, a PLD includes multiple configurable LBs, I/O block(s), and programmable DSP blocks operable to perform one or more logic functions based on the programming settings. While the configurable LBs can be selectively programmed to perform one or more logic functions, the I/O block having a group of I/O ports is used to facilitate data transfer. The programmable DSP blocks are configured to perform various predefined logic functions using the built-in DSP functions. Each of the programmable DSP blocks includes at least one CDSP which further includes an HMB. The HMB, in one embodiment, includes a 27×18 multiplier and a 12×12 multiplier. In one example, the 27×18 multiplier includes Padd 404 for performing an addition/subtraction before multiplication. The CDSP further includes a shifter configured to shift at least a portion of data to a neighboring programmable DSP block. ALU 462 is configured to combine a first product result from the 27×18 multiplier and a second product result from the 12×12 multiplier before outputting combined result.

An advantage of using an HMB is that the 27×18 multiplier such as multiplier 406 can be reconfigured to a 12×12 multiplier by for instance padding zeros "0" so that the CDSP can have two 12×12 multiplier for its operation(s).

Figure 5:
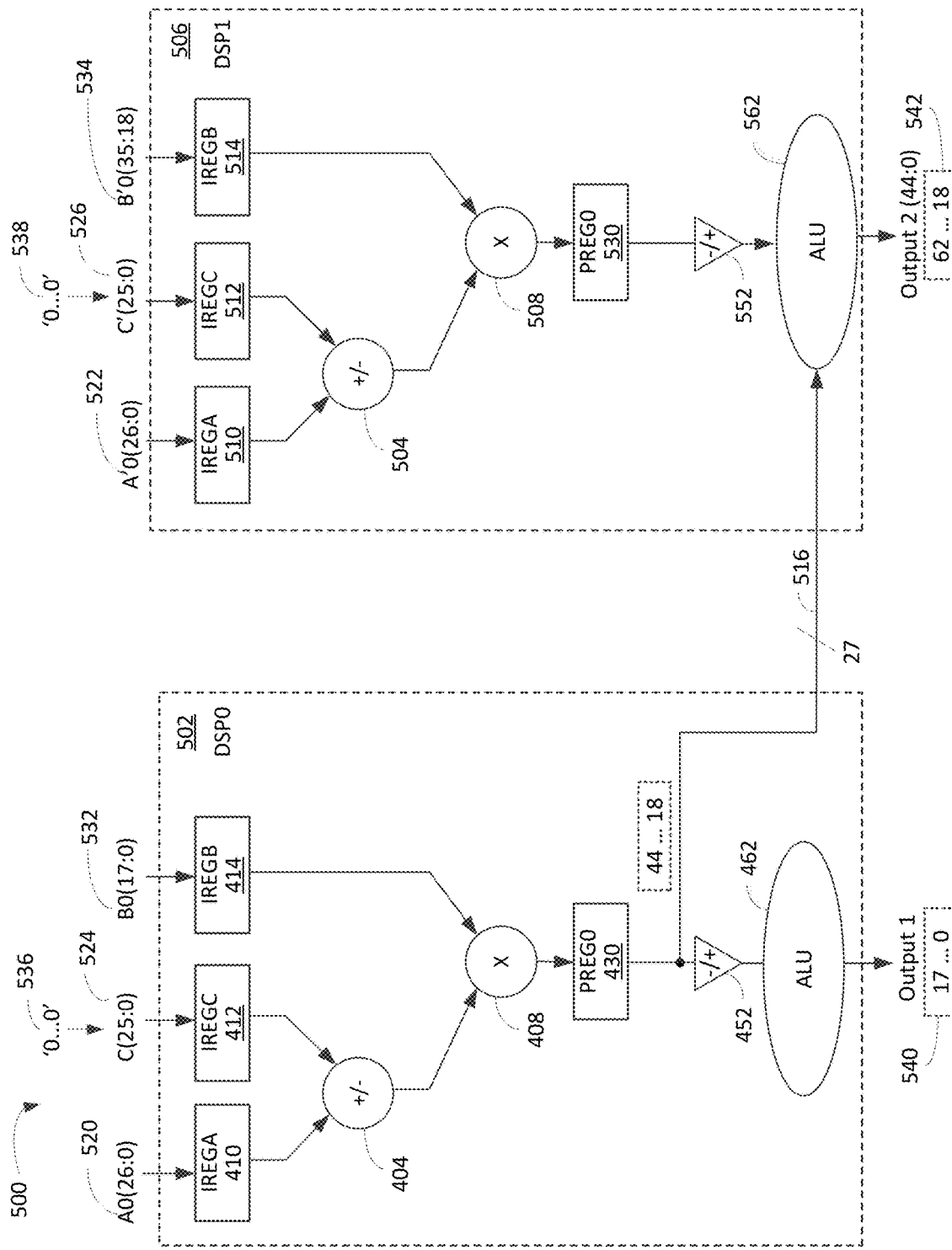
FIG. 5 is a block diagram illustrating an extended multiplication involving more than one CDSP in accordance with one embodiment of the present invention.

FIG. 5 is a block diagram 500 illustrating an extended multiplication involving more than one CDSP in accordance with one embodiment of the present invention. Diagram 500 includes a DSP0 502 and DSP1 506 wherein both CDSP0 and CDSP1 are configured or programmed to work together to perform an extended multiplication such as a multiplication of 27-bit operand by 36-bit operand. It should be noted that the underlying concept of the exemplary embodiment(s) of the present invention would not change if one or more blocks (circuit or elements) were added to or removed from diagram 500.

DSP0 502, in one aspect, includes IregA 410, IregC 412, and IregB 414, Padd 404, 27×18 multiplier 408, Preg0 430, and ALU 462. Similarly, DSP1 506 includes IregA 510, IregC 512, and IregB 514, Padd 504, 27×18 multiplier 508, Preg0 530, and ALU 562. Depending on the applications, Padds 404 and 504 can be employed to update or modify A0 and/or A'0 operand(s) using C and/or C' operand(s) via IregC 412 or IregC 512. In the event that updating and/or modifying A0 and/or A'0 is not required, IregC 412 and/or IregC 512 can be set with zero logic values as indicated by numeral 536-538.

To multiply a first operand with 27 bits and a second operand with 36 bits, two CDSPs such as CDSP0 and CDSP1 are programmed to perform the operation. In operation, A0 520 and A'0 522 are used to receive the same first operand with 27 bits. B0 532, in one example, receives the lower portion of the second operand with the bit position from 0 to 17 while B'0 534 receives the upper or higher portion of the second operand with the bit position from 18 to 35. C operand 524 (or 526) can be optionally used for an add operation before the multiplication if it is desirable. If add and subtract operations are not needed, both registers IregCs 412 and 512 can be padded with zeros "0". While the lower portion of the multiplication between A0 520 and B0 (17:0) 532 are performed by 27×18 multiplier 408 at DSP0, the upper portion of the multiplication between A'0 522 and B'0 (35:18) 534 are performed by 27×18 multiplier 508 at DSP1. The product results of DSP0 and DSP1 are combined at ALUs 462 and 562.

ALU 462, in one embodiment, is configured to provide a lower portion of the product result or output 1 540. For example, the low portion of the product result can be the first 18 bits from bit position 0 to bit position 17. ALU 562, in one aspect, receives inputs from DSP0 via bus 516 with, for example, a 27-bit content from Preg0 430. For example, the content represented by the bit position 18 to 44 in Preg0 is shipped to DSP1 for multiplication. ALU 562, in one aspect, is configured to have sufficient bandwidth for handling the product result of a multiplication. ALU 562 is capable of providing output 2 542 with 45 bits of product result. It should be noted that various other components within DSP0 and DSP1 can be programmed to be inactive or sleeping mode. For example, a second multiplier such as a 12×12 multiplier in DSP0 or DSP1 may be deactivated for the present implementation.

An advantage of using CDSP having HMBs is that the HMBs are capable of being linked to perform mathematic operations with large operands.

The exemplary embodiment of the present invention includes various processing steps, which will be described below. The steps of the embodiment may be embodied in machine or computer executable instructions. The instructions can be used to cause a general purpose or special purpose system, which is programmed with the instructions, to perform the steps of the exemplary embodiment of the present invention. Alternatively, the steps of the exemplary embodiment of the present invention may be performed by specific hardware components that contain hard-wired logic for performing the steps, or by any combination of programmed computer components and custom hardware components.

Figure 6:
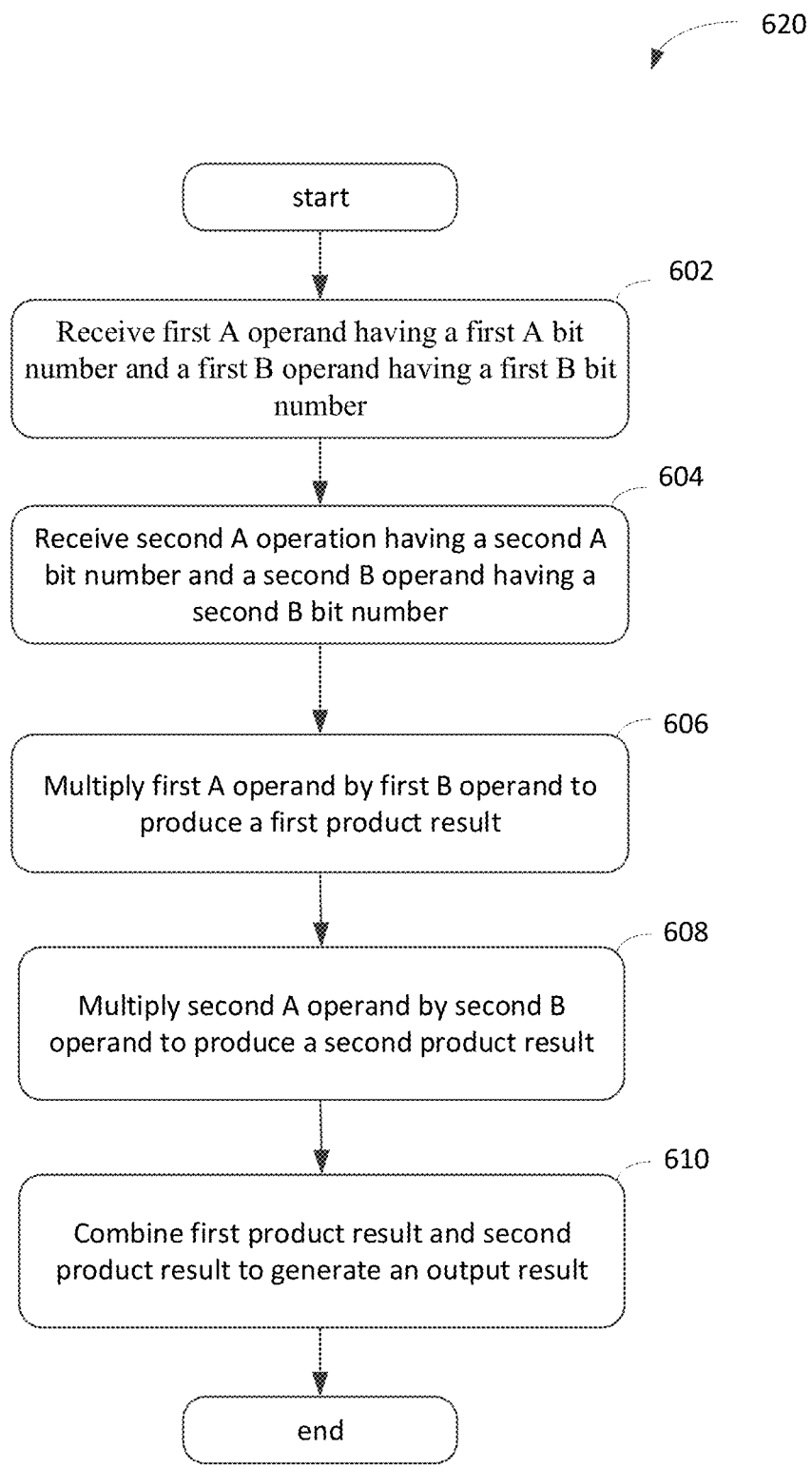
FIG. 6 is a flowchart illustrating a process of implementation of HMB in a CDSP in accordance with one embodiment of the present invention.

FIG. 6 is a flowchart 600 illustrating a process of implementation of CDSP in accordance with one embodiment of the present invention. At block 602, a process of programmable DSP block within an FPGA for signal processing is able to receive a first A operand having a first A bit number and a first B operand having a first B bit number. For example, the first A operand is represented in 27 bits and the first B operand is represented in 18 bits.

At block 604, a second A operation having a second A bit number and a second B operand having a second B bit number are received. In one example, the second A operand is represented in 12 bits and the second B operand is represented in 12 bits.

At block 606, a first multiplier multiplies the first A operand with the first B operand to produce a first product result. If A operand is 27 bits wide and B operand is 18 bits wide, the first multiplier is a 27×18 multiplier. Note that the 27×18 multiplier, in one aspect, can also be programmed to multiply any bit number of operands as long as A operand is less than 27 bits and B operand is less than 18 bits.

At block 608, a second multiplier in the programmable DSP block multiplies the second A operand with the second B operand to produce a second product result. If A operand is 12 bits wide and B operand is 12 bits wide, the second multiplier is a 12×12 multiplier.

At block 610, the first product result and the second product result are combined to generate an output result for the CDSP. In one aspect, after receiving a C operand having a C bit number, the C operand is added to or subtracted from the first A operand to generate a pre-add summation. In one embodiment, an HMB is able to shift at least a portion of the first A operand to a neighboring DSP block. Note that the programmable DSP block is configured to receive control signals from external block for configuring the programmable DSP block.

The following Table 1 shows various programmable options in accordance certain features using multiple CDSPs.

TABLE 1

| Multiplier(s) | PreAdder operation | Cascade add/acc | Shift chain |
|---|---|---|---|
| Two (2): 12 × 12 | No | No | No |
| One (1): (12 × 12) + (12 × 12) | No | Yes | No |
| One (1): 27 × 18 | Yes | Yes | Yes |
| One (1): 27 × 36 (requires 2 CDSP) | Yes | No | Yes |

Figure 7:
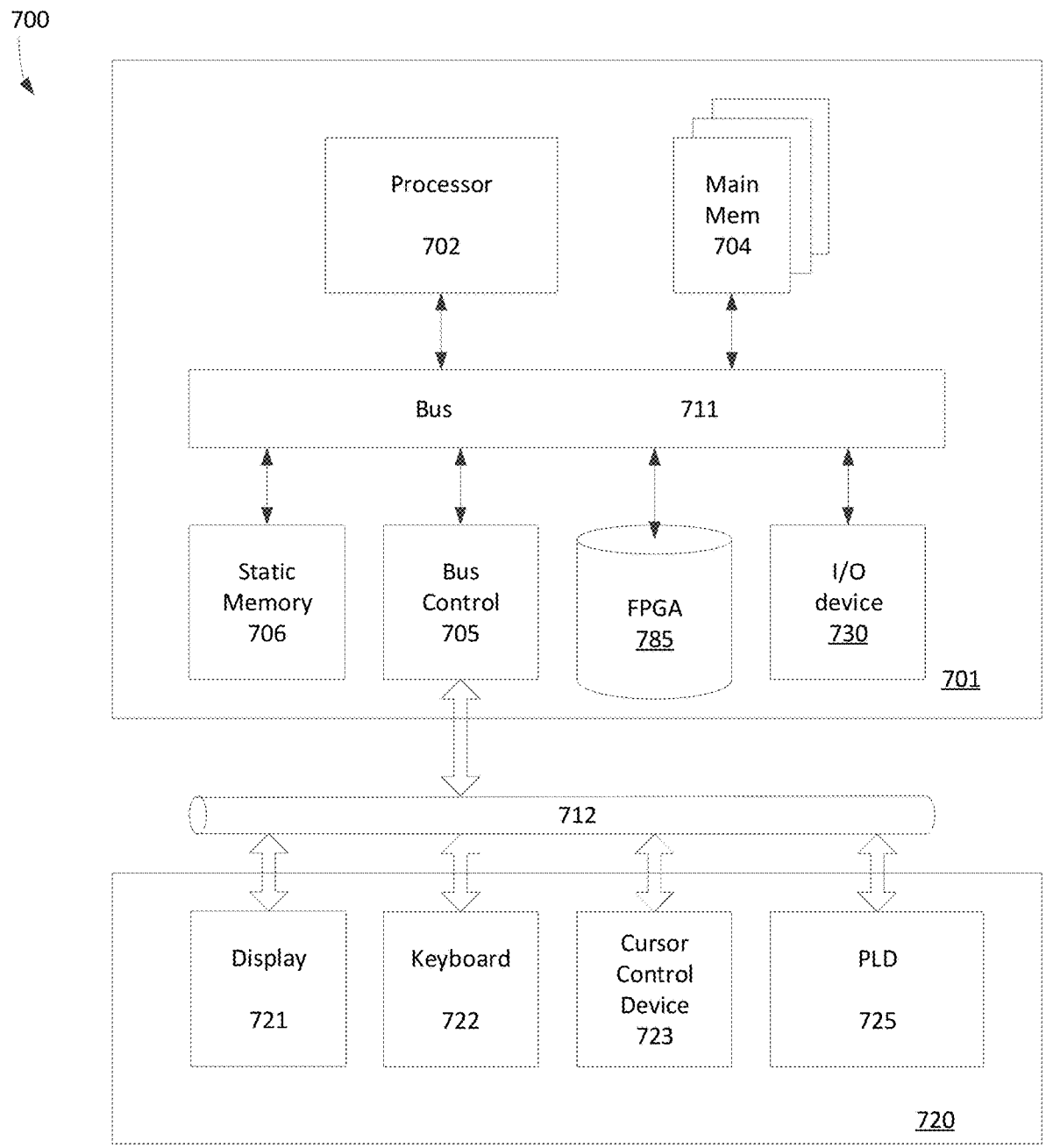
FIG. 7 is a diagram illustrating a system or computer using one or more PSDs having DSPs for signal processing in accordance with one embodiment of the present invention.

FIG. 7 is a diagram illustrating a system or computer 700 using one or more PSDs having DSPs for signal processing in accordance with one embodiment of the present invention. Computer system 700 includes a processing unit 701, an interface bus 712, and an input/output ("IO") unit 720. Processing unit 701 includes a processor 702, main memory 704, system bus 711, static memory device 706, bus control unit 705, I/O element 730, and FPGA 785. It should be noted that the underlying concept of the exemplary embodiment(s)

of the present invention would not change if one or more blocks (circuit or elements) were added to or removed from FIG. 7.

Bus 711 is used to transmit information between various components and processor 702 for data processing. Processor 702 may be any of a wide variety of general-purpose processors, embedded processors, or microprocessors such as ARM® embedded processors, Intel® Core™ Duo, Core™ Quad, Xeon®, Pentium™ microprocessor, Motorola™ 68040, AMD® family processors, or Power PC™ microprocessor.

Main memory 704, which may include multiple levels of cache memories, stores frequently used data and instructions. Main memory 704 may be RAM (random access memory), MRAM (magnetic RAM), or flash memory. Static memory 706 may be a ROM (read-only memory), which is coupled to bus 711, for storing static information and/or instructions. Bus control unit 705 is coupled to buses 711-712 and controls which component, such as main memory 704 or processor 702, can use the bus. Bus control unit 705 manages the communications between bus 711 and bus 712. Mass storage memory or SSD which may be a magnetic disk, an optical disk, hard disk drive, floppy disk, CD-ROM, and/or flash memories are used for storing large amounts of data.

I/O unit 720, in one embodiment, includes a display 721, keyboard 722, cursor control device 723, and low-power PLD 725. Display device 721 may be a liquid crystal device, cathode ray tube ("CRT"), touch-screen display, or other suitable display device. Display 721 projects or displays images of a graphical planning board. Keyboard 722 may be a conventional alphanumeric input device for communicating information between computer system 700 and computer operator(s). Another type of user input device is cursor control device 723, such as a conventional mouse, touch mouse, trackball, or other type of cursor for communicating information between system 700 and user(s).

PLD 725 is coupled to bus 712 for providing configurable logic functions to local as well as remote computers or servers through wide-area network. PLD 725 and/or FPGA 785 includes various programmable DSP blocks and HMBs for signal data processing. In one example, PLD 725 may be used in a modem or a network interface device for facilitating communication between computer 700 and the network. Computer system 700 may be coupled to a number of servers via a network infrastructure as illustrated in the following discussion.

Figure 8:
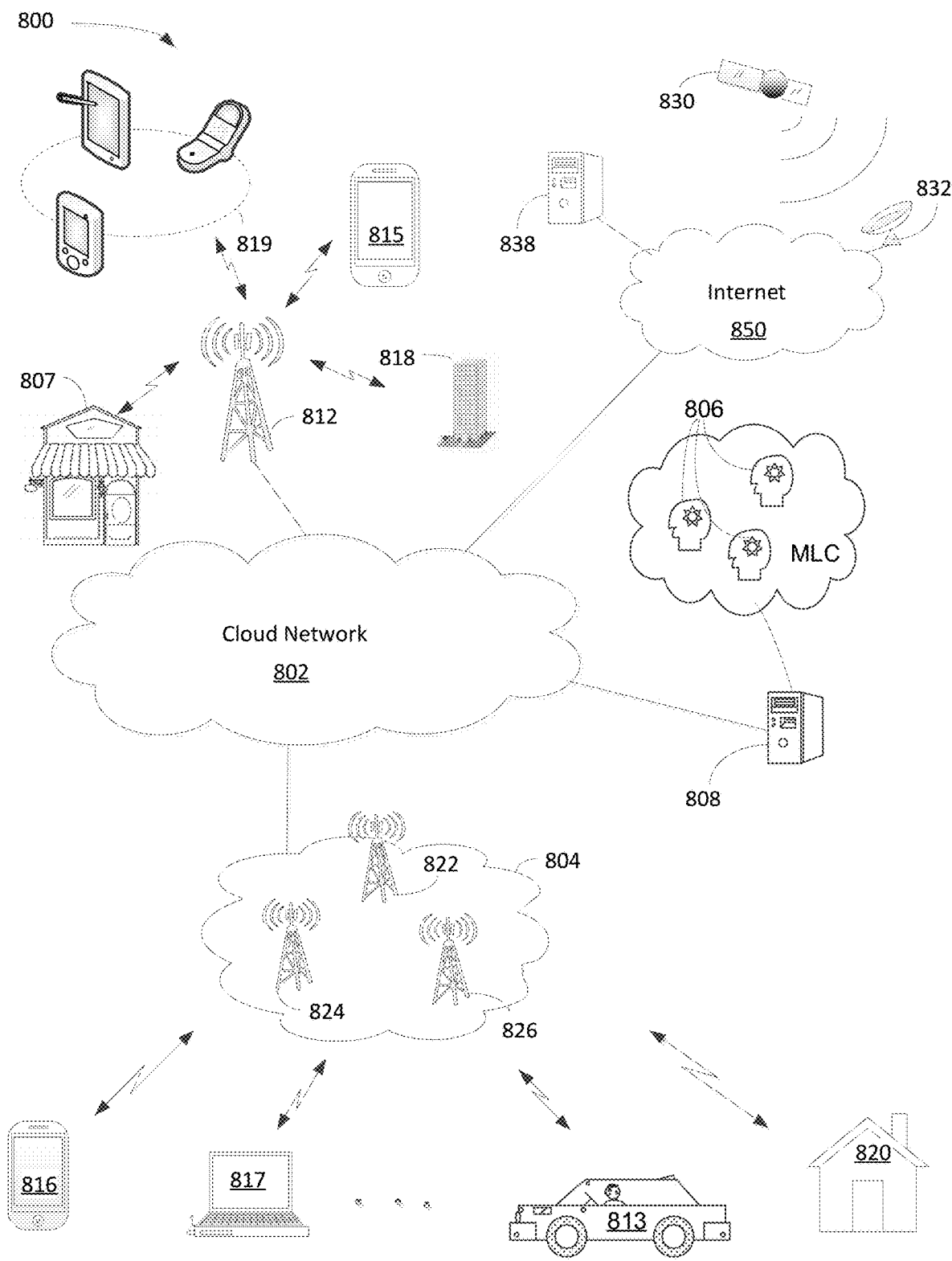
FIG. 8 is a block diagram illustrating various applications of PSD or FPGA containing CDSPs that can be used in a cloud-based environment in accordance with one embodiment of the present invention.

FIG. 8 is a block diagram 800 illustrating various applications of PSD or FPGA containing CDSPs that can be used in a cloud-based environment in accordance with one embodiment of the present invention. Diagram 800 illustrates AI server 808, communication network 802, switching network 804, Internet 850, and portable electric devices 813-819. In one aspect, PSD or FPGA having various HMBs can be used in AI server, portable electric devices, and/or switching network. Network or cloud network 802 can be wide area network ("WAN"), metropolitan area network ("MAN"), local area network ("LAN"), satellite/terrestrial network, or a combination of WAN, MAN, and LAN. It should be noted that the underlying concept of the exemplary embodiment(s) of the present invention would not change if one or more blocks (or networks) were added to or removed from diagram 800.

Network 802 includes multiple network nodes, not shown in FIG. 8, wherein each node may include mobility management entity ("MME"), radio network controller ("RNC"), serving gateway ("S-GW"), packet data network gateway ("P-GW"), or Home Agent to provide various network functions. Network 802 is coupled to Internet 850, AI server 808, base station 812, and switching network 804. Server 808, in one embodiment, includes machine learning computers ("MLC") 806.

Switching network 804, which can be referred to as packet core network, includes cell sites 822-826 capable of providing radio access communication, such as 3G ($3^{rd}$ generation), 4G, or 5G cellular networks. Switching network 804, in one example, includes IP and/or Multiprotocol Label Switching ("MPLS") based network capable of operating at a layer of Open Systems Interconnection Basic Reference Model ("OSI model") for information transfer between clients and network servers. In one embodiment, switching network 804 is logically coupling multiple users and/or mobiles 816-820 across a geographic area via cellular and/or wireless networks. It should be noted that the geographic area may refer to a campus, city, metropolitan area, country, continent, or the like.

Base station 812, also known as cell site, node B, or eNodeB, includes a radio tower capable of coupling to various user equipments ("UEs") and/or electrical user equipments ("EUEs"). The term UEs and EUEs are referring to the similar portable devices and they can be used interchangeably. For example, UEs or PEDs can be cellular phone 815, laptop computer 817, iPhone® 816, tablets and/or iPad® 819 via wireless communications. Handheld device can also be a smartphone, such as iPhone®, BlackBerry®, Android®, and so on. Base station 812, in one example, facilitates network communication between mobile devices such as portable handheld device 813-819 via wired and wireless communications networks. It should be noted that base station 812 may include additional radio towers as well as other land switching circuitry.

Internet 850 is a computing network using Transmission Control Protocol/Internet Protocol ("TCP/IP") to provide linkage between geographically separated devices for communication. Internet 850, in one example, couples to supplier server 838 and satellite network 830 via satellite receiver 832. Satellite network 830, in one example, can provide many functions as wireless communication as well as global positioning system ("GPS"). It should be noted that FPGA or PLD with HMBs can be applied a lot of fields, such as, but not limited to, smartphones 813-819, satellite network 830, automobiles 813, AI server 808, business 807, and homes 820.

While particular embodiments of the present invention have been shown and described, it will be obvious to those of ordinary skills in the art that based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. A semiconductor device able to be selectively programmed to perform one or more logic functions utilizing a programmable digital signal processing ("DSP") block, the device comprising:
    a plurality of configurable logic blocks ("LBs") able to be selectively programmed to perform one or more logic functions; and
    at least one programmable DSP block coupled to the plurality of configurable LBs and configured to have at least one configurable DSP ("CDSP") which allows a user to program size of operands, wherein the CDSP contains a first multiplier and a second multiplier, the first multiplier operable to multiple a first set of operands with a first set of bit numbers, the second multiplier operable to multiple a second set of operands with a second set of bit numbers.

2. The device of claim 1, wherein the first set of bit numbers are different than the second set of bit numbers.

3. The device of claim 1, wherein the first set of operands includes a 27-bit operand and an 18-bit operand (27×18).

4. The device of claim 3, wherein the second set of operands is 12 bits by 12 bits (12×12) operands.

5. The device of claim 1, wherein the first multiplier is a 27×18 multiplier and the second multiplier is a 12×12 multiplier.

6. The device of claim 1, wherein the first multiplier includes a pre-adder ("Padd") to perform an addition before multiplication.

7. The device of claim 1, wherein the CDSP includes one or more hybrid multiplier blocks ("HMBs") wherein each of the HMBs includes a shifter configured to shift at least a portion of data to a neighboring CDSP.

8. The device of claim 1, wherein the CDSP includes a data output ("DOUT") component configured to combine a first product result from the first multiplier and a second product result from the second multiplier before outputting an output.

9. The device of claim 1, further comprising an input and output ("I/O") block coupled to the plurality of configurable LBs and configured to have a plurality of I/O ports for facilitating data transfer.

10. A programmable semiconductor integrated circuit fabricated on a single microchip able to provide various digital signal processing functions comprising the device of claim 1.

11. A method of programmable digital signal processing ("DSP") block in a field programmable gate array ("FPGA") configured to processing data, comprising:
configuring a programmable DSP to determine size of operands in accordance with signals provided by a user;
receiving a first A operand having a first A bit number and a first B operand having a first B bit number;
receiving a second A operand having a second A bit number and a second B operand having a second B bit number;
multiplying, by a first multiplier in a programmable DSP block, the first A operand by the first B operand to produce a first product result;
multiplying, by a second multiplier in the programmable DSP block, the second A operand by the second B operand to produce a second product result; and
combining the first product result and the second product result to generate an output result for the programmable DSP block.

12. The method of claim 11, further comprising:
receiving a C operand having a C bit number; and
adding the C operand with the first A operand to generate a pre-add summation.

13. The method of claim 11, wherein receiving a first A operand includes receiving an operand represented in 27 bits.

14. The method of claim 13, wherein receiving a first B operand includes receiving an operand represented in 18 bits.

15. The method of claim 14, wherein receiving a second A operand includes receiving an operand represented in 12 bits and receiving a second B operand includes receiving an operand represented in 12 bits.

16. The method of claim 11, further comprising shifting at least a portion of the first A operand to a neighboring DSP block.

17. The method of claim 11, further receiving control signals from external block for configuring the programmable DSP block.

18. A programmable logic device having a programmable digital signal processing ("DSP") block operable to be selectively programmed to perform one or more logic functions, the device comprising:
a plurality of configurable logic blocks ("LBs") able to be selectively programmed to perform one or more logic functions;
an input and output ("I/O") block coupled to the plurality of configurable LBs and configured to have a plurality of I/O ports for facilitating data transfer; and
a plurality of configurable DSPs ("CDSPs") coupled to the plurality of configurable LBs and configured to perform one or more selected predefined logic functions, wherein each of the plurality of CDSPs allows a user to program size of operands and includes a 27×18 multiplier and a 12×12 multiplier.

19. The device of claim 18, wherein the 27×18 multiplier includes a pre-adder ("Padd") configured to perform an addition before multiplication.

20. The device of claim 18, wherein each of the plurality of CDSPs includes a shifter configured to shift at least a portion of data to a neighboring CDSP.

21. The device of claim 18, wherein each of the plurality of the CDSPs includes a data output ("DOUT") component configured to combine a first product result from the 27×18 multiplier and a second product result from the 12×12 multiplier.

* * * * *